United States Patent
Kweon (10) Patent No.: US 6,414,344 B1
(45) Date of Patent: Jul. 2, 2002

(54) SEMICONDUCTOR DEVICE FOR USE IN A MEMORY CELL AND METHOD FOR THE MANUFACTURE THEREOF

(75) Inventor: Soon-Yong Kweon, Ichon-shi (KR)

(73) Assignee: Hyundai Electronics Industries Cl., Ltd., Ichon-shi (KR)

( * ) Notice: Subject to any disclaimer, the term of this patent is extended or adjusted under 35 U.S.C. 154(b) by 34 days.

(21) Appl. No.: 09/604,773

(22) Filed: Jun. 28, 2000

(30) Foreign Application Priority Data

Jun. 28, 1999 (KR) .......................................... 99-25000

(51) Int. Cl.[7] .............................................. H01L 29/72
(52) U.S. Cl. ....................... 257/295; 257/296; 257/303; 257/532; 257/741; 257/751; 438/239; 438/396; 438/608; 438/650; 438/654; 438/686
(58) Field of Search ................................ 257/295, 296, 257/303, 532, 751, 741; 438/239, 396, 608, 650, 654, 686

(56) References Cited

U.S. PATENT DOCUMENTS

| 5,407,855 | A | | 4/1995 | Maniar et al. | |
|---|---|---|---|---|---|
| 5,510,651 | A | * | 4/1996 | Maniar et al. | ............. 257/295 |
| 5,668,040 | A | | 9/1997 | Byun | |
| 5,763,633 | A | | 6/1998 | Vaartstra | |

FOREIGN PATENT DOCUMENTS

| JP | 7-99290 | 4/1995 | ........... H01L/27/04 |
|---|---|---|---|
| JP | 09045872 | 2/1997 | ........... H01L/27/10 |
| JP | 10056140 | 2/1998 | ........... H01L/27/10 |
| JP | 10189885 | 7/1998 | ........... H01L/27/10 |
| JP | 10242408 | 9/1998 | ........... H01L/27/10 |
| JP | 11220095 | 8/1999 | ........... H01L/27/04 |
| JP | 11233732 | 8/1999 | ........... H01L/27/10 |
| JP | 11243179 | 9/1999 | ........... H01L/27/10 |

* cited by examiner

Primary Examiner—Edward Wojciechowicz
(74) Attorney, Agent, or Firm—Jacobson Holman, PLLC (57) ABSTRACT

A semiconductor device for use in a memory cell includes an active matrix provided with a silicon substrate, a transistor formed on the silicon substrate and isolation regions for isolating the transistor, a capacitor structure formed on top of the active matrix and a metal interconnection for electrically connecting the capacitor structure to the transistor, wherein the capacitor structure includes a bottom and a top electrodes and a capacitor thin film sandwiched therebetween. In the semiconductor device, the bottom electrode is made of a material such as iridium, ruthenium or the like. In order to improve the adhesion between the bottom electrode and insulating layers adjacent thereto, the bottom electrode is encompassed with a metal oxide such as a iridium oxide, ruthenium oxide or the like.

24 Claims, 8 Drawing Sheets

SEMICONDUCTOR DEVICE FOR USE IN A MEMORY CELL AND METHOD FOR THE MANUFACTURE THEREOF

FIELD OF THE INVENTION

The present invention relates to a semiconductor device; and, more particularly, to a semiconductor device having at least one memory cell which has a capacitor structure incorporating an improved electrode therein and a method for the manufacture thereof.

DESCRIPTION OF THE PRIOR ART

As is well known, a dynamic random access memory (DRAM) with at least one memory cell comprised of a transistor and a capacitor has a higher degree of integration mainly by down-sizing through micronization. However, there is still a demand for downsizing the area of the memory cell.

To meet the demand, there have been proposed several structures for the capacitor, such as a trench type or a stack type capacitor, which are arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been proposed a ferroelectric memory (FeRAM) where a capacitor thin film with ferroelectric properties such as strontium bithmuth tantalate (SBT) is used for capacitor in place of conventional silicon oxide film or silicon nitride film.

Figure 1:
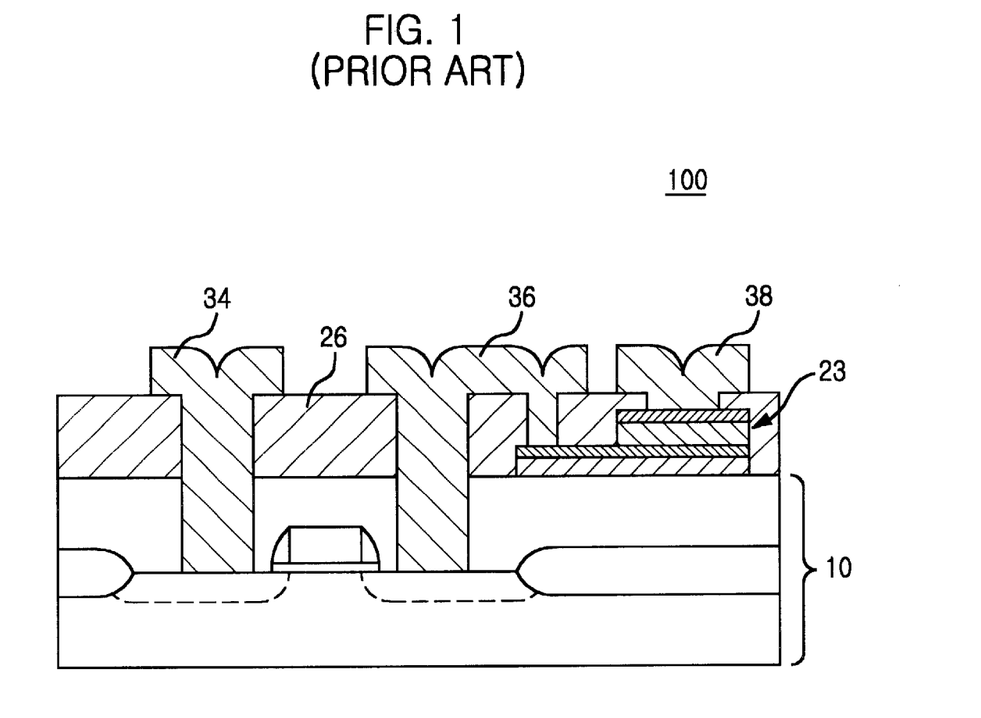
FIG. 1 shows a cross sectional view representing a conventional semiconductor memory device having a capacitor structure.

In FIG. 1, there is shown a cross sectional view setting forth a conventional semiconductor memory device 100 for use as FeRAM, disclosed in U.S. Pat. No. 5,864,153, entitled "CAPACITOR STRUCTURE OF SEMICONDUCTOR MEMORY CELL AND FABRICATION PROCESS THEREOF". The semiconductor memory device 100 includes an active matrix 10 incorporating a metal oxide semiconductor (MOS) transistor therein, a capacitor structure 23 formed on top of the active matrix 10, a bit line 34, a metal interconnection 36 and a plate line 38.

In FIGS. 2A to 2E, there are illustrated manufacturing steps involved in manufacturing the conventional semiconductor memory device 100.

Figure 2A:
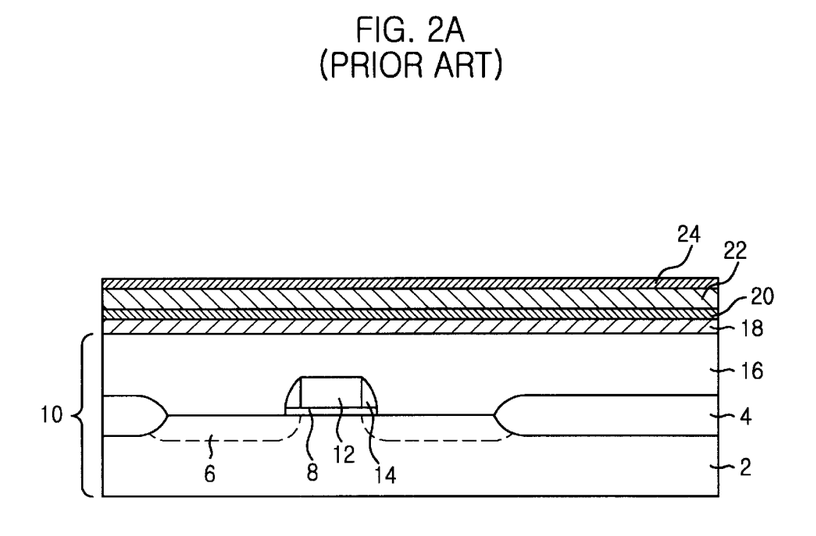
FIGS. 2A to 2E are schematic cross sectional views illustrating a prior art method for the manufacture of a semiconductor memory device.

The process for manufacturing the conventional semiconductor memory device 100 begins with the preparation of an active matrix 10 having a silicon substrate 2, a MOS transistor formed thereon as a selective transistor, an isolation region 4 and a first insulating layer 16 formed on the MOS transistor and the isolation region 4. The first insulating layer 16, e.g., made of boron-phosphor-silicate glass (BPSG), is formed over the entire surface by using a chemical vapor deposition (CVD) technique. The MOS transistor includes a pair of diffusion regions 6 serving as a source and a drain, a gate oxide 8, a spacer 14 and a gate line 12.

In a subsequent step, there is formed on top of the active matrix 10 a buffer layer 18, a first metal layer 20, a dielectric layer 22 and a second metal layer 24, sequentially, as shown in FIG. 2A. The buffer layer 18 is made of titanium (Ti) and the first metal layer 20 is made of platinum (Pt). The dielectric layer 22 is made of a ferroelectric material. The buffer, the first and the second metal layers 18, 22, 24 are deposited with a sputter and the dielectric layer 20 is spin-on coated.

Figure 2B:
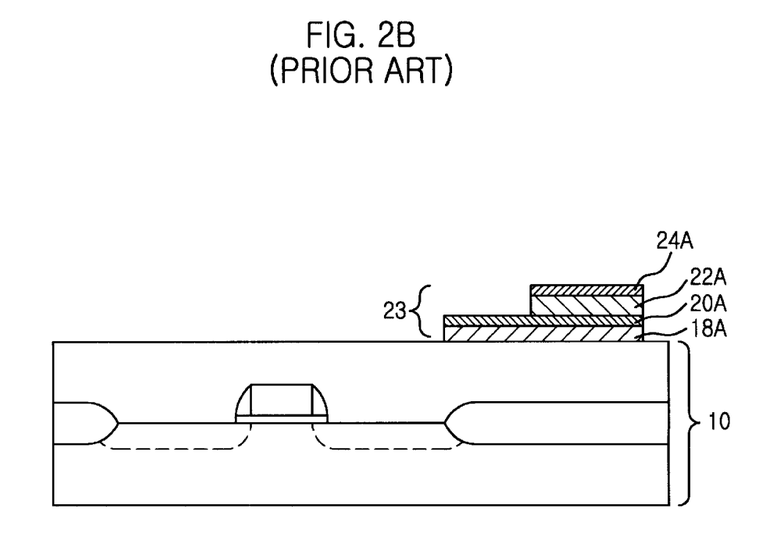

Thereafter, the second metal layer 24 and the dielectric layer 22 are patterned into a predetermined configuration. And then, the first metal layer 20 and the buffer layer 18 are patterned into a second predetermined configuration by using a photolithography method to thereby obtain a capacitor structure 23 having a buffer 18A, a bottom electrode 20A, a capacitor thin film 22A and a top electrode 24A, as shown in FIG. 2B. The buffer layer 18A is used for ensuring reliable adhesion between the bottom electrode 20A and the first insulating layer 16.

Figure 2C:
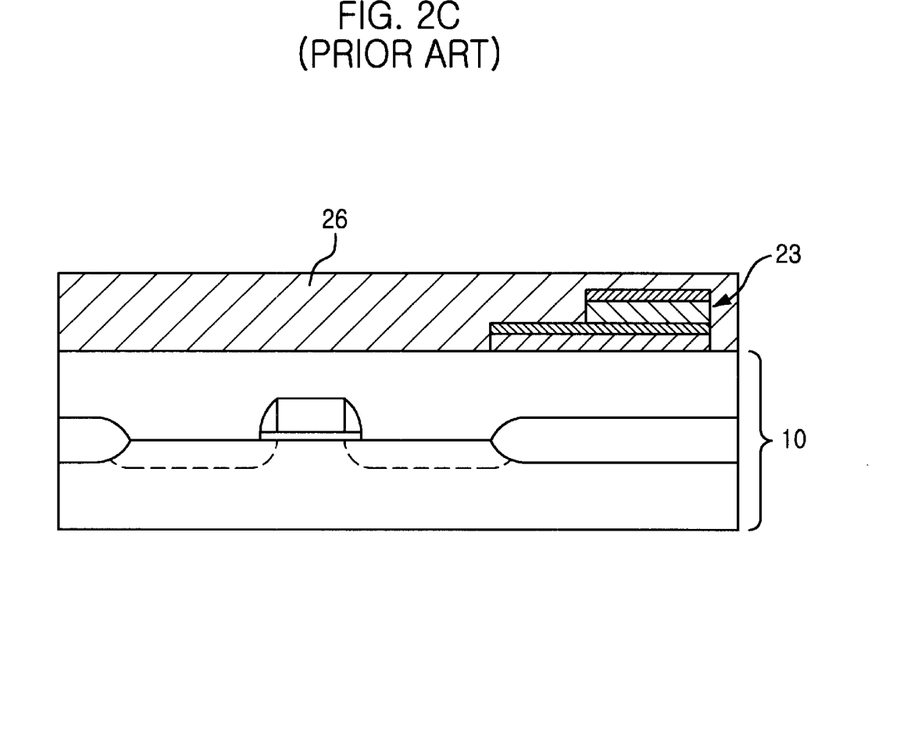

In a next step, a second insulating layer 26, e.g., made of silicon dioxide ($SiO_2$), is formed on top of the active matrix 10 and the capacitor structure 23 by using a plasma CVD, as shown in FIG. 2C.

Figure 2D:
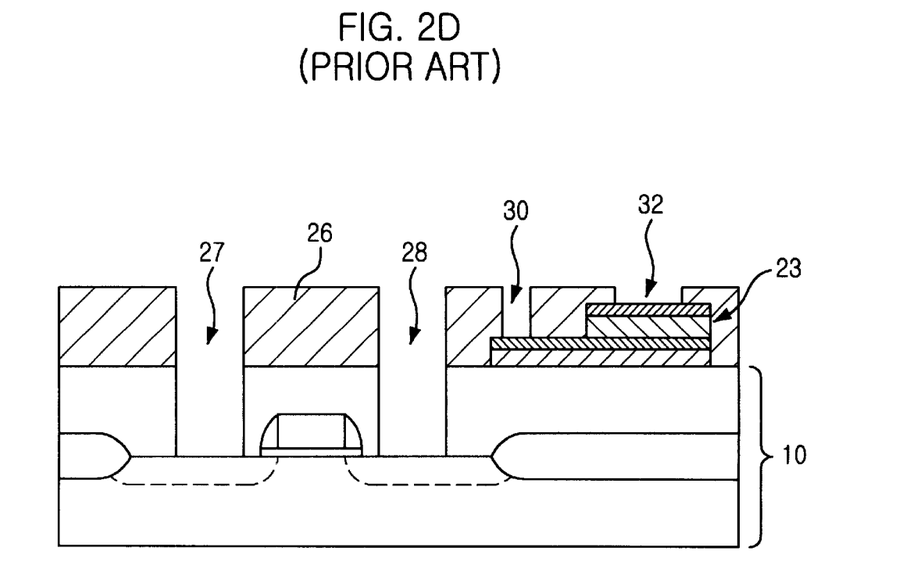

In an ensuing step, a first and a second openings 27, 28 are formed in the second and the first insulating layers 26, 16, thereby exposing the diffusion regions 6, respectively. A third and a fourth openings 30, 32 are formed on top of the capacitor structure 23 through the second insulating layer 26, thereby exposing portions of the bottom and the top electrodes 20A, 24A, respectively, as shown in FIG. 2D.

Figure 2E:
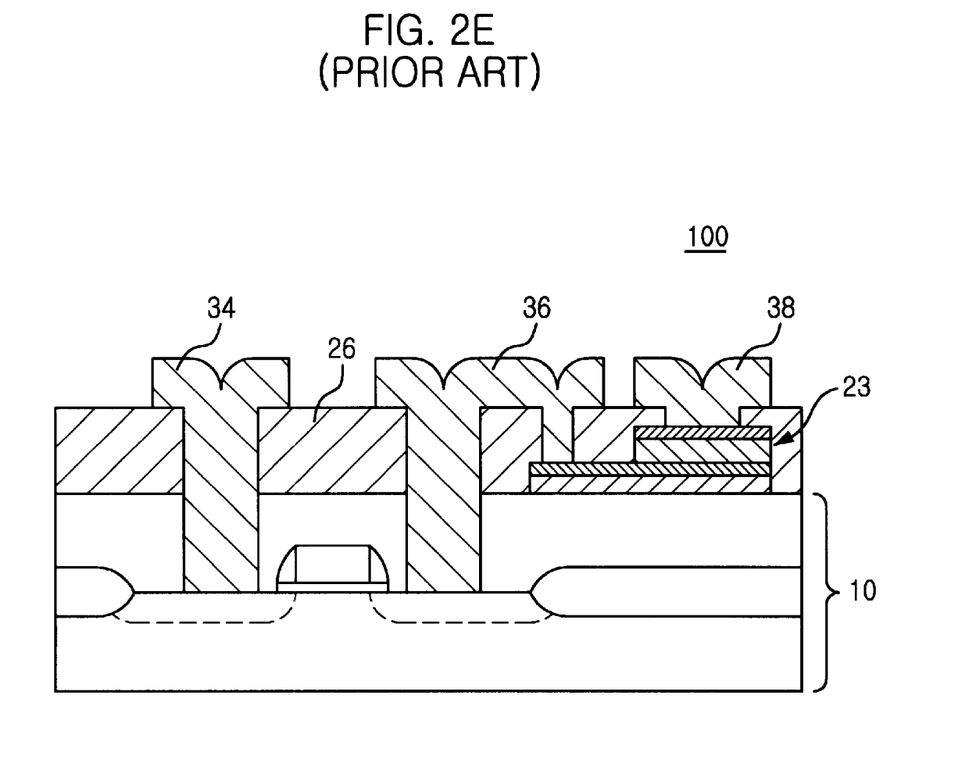

Finally, an interconnection layer is formed over the entire surface including the interiors of the openings 27, 28, 30, 32, and is patterned to form a bit line 34, a metal interconnection 36 and a plate line 38, thereby obtaining the semiconductor memory device 100, as shown in FIG. 2E.

Even though the aforementioned semiconductor memory device 100 and the method for the manufacture thereof is utilizing the buffer layer 18 to secure reliable adhesion between the bottom electrode 20A and the first insulating layer 16, it still suffers from a bad adhesion therebetween due to the different crystallographic properties from each other.

Furthermore, the bottom electrode 20A does not adhere to the second insulating layer 26 at the interface therebetween since the crystallographic property of the bottom electrode 20A is very different from that of the second insulating layer.

These problems, therefore, tend to make it difficult to obtain the desired reproducibility, reliability and yield.

SUMMARY OF THE INVENTION

It is, therefore, an object of the present invention to provide a semiconductor memory device having an improved adhesion between the bottom electrode and the insulating layers surrounding the bottom electrode.

It is another object of the present invention to provide a method for manufacturing a semiconductor memory device having an improved adhesion between the bottom electrode and the insulating layers surrounding the bottom electrode.

In accordance with one aspect of the present invention, there is provided a semiconductor device for use in a memory cell, including: an active matrix provided with a semiconductor substrate, a transistor formed on the semiconductor substrate, an isolation region for isolating the transistor and an insulating layer formed on top of the transistor and the isolation region, a bottom electrode formed on top of the insulating layer, a capacitor thin film placed on top of the bottom electrode and a top electrode formed on top of the capacitor thin film, wherein the bottom electrode is divided into metal oxide portions and a metal portion sandwiched between the metal oxide portions.

In accordance with another aspect of the present invention, there is provided a method for manufacturing a semiconductor device for use in a memory cell, the method including the steps of: a) preparing an active matrix provided with a semiconductor substrate, a transistor including a pair of diffusion regions formed on top of the semiconductor substrate and a first insulating layer formed around the transistor; b) forming a first metal oxide layer on top of the first insulating layer; c) forming a first metal layer and a second metal oxide layer on top of the first metal oxide layer, subsequently; d) a dielectric layer on top of the second metal oxide layer; e) a second metal layer on top of the dielectric layer; and f) patterning the second metal layer, the dielectric layer, the second metal oxide layer, the first metal layer and the first metal oxide layer into a first predetermined configuration, thereby obtaining a capacitor structure.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 3 and 4A to 4F a cross sectional view of a semiconductor device 200 for use in a memory cell and cross sectional views setting forth a method for the manufacture thereof in accordance with preferred embodiments of the present invention. It should be noted that like parts appearing in FIGS. 3 and 4A to 4F are represented by like reference numerals.

Figure 3:
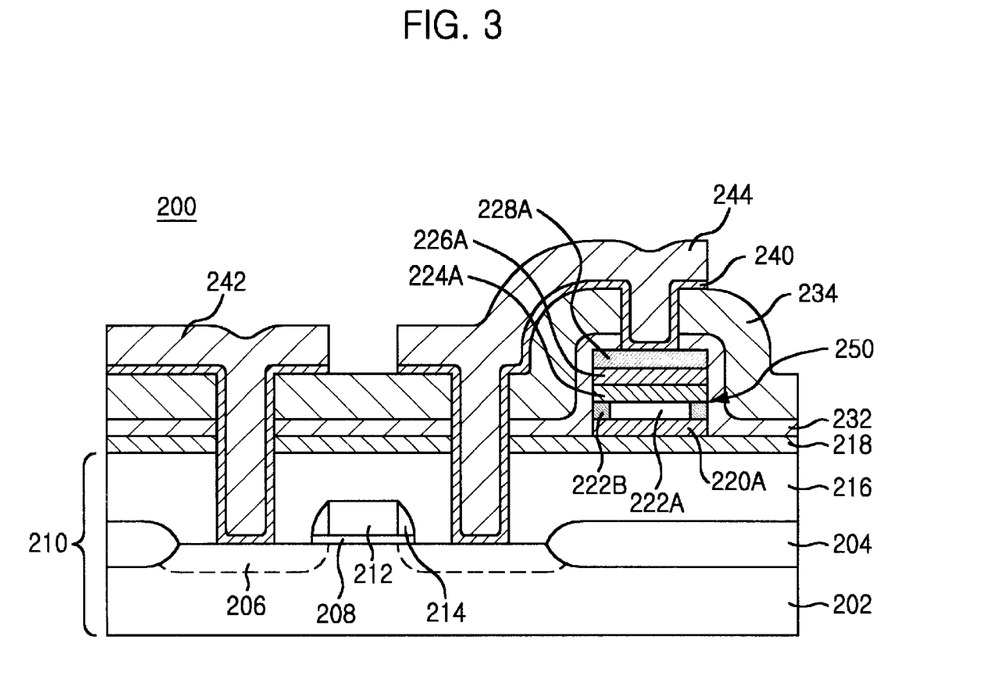
FIG. 3 is a cross sectional view setting forth a semiconductor device in accordance with the present invention.

In FIG. 3, there is provided a cross sectional view of the inventive semiconductor device 200 comprising an active matrix 210, a second insulating layer 234, a bit line 242, a metal interconnection 244 and a capacitor structure 250. A protection layer 218, e.g., made of SiOx, can be disposed between the bottom electrode 222A and the first insulating layer 216 for protecting the active matrix 210 from the following processes. And also, in order to protect the capacitor structure 250, a capping layer 232, e.g., made of a material such as tetra ethyl ortho silicate (TEOS), can be formed on top of the capacitor structure 250.

The active matrix 210 includes a semiconductor substrate 202, an isolation region 204, diffusion regions 206, a gate oxide 208, a gate line 212 formed on top of the gate oxide 208, a spacer 214 formed around the gate line 212 and a first insulating layer 216. One of the diffusion regions 206 serves as a source and the other diffusion region 206 serves as a drain. The capacitor structure 250 includes a first and a second patterned metal oxide layers 220A, 224A, a bottom electrode 222A sandwiched between the first and the second metal oxide layers 220A, 224A, a capacitor thin film 226A and a top electrode 228A formed on top of the capacitor thin film 226A. In order to improve an adhesion between the bottom electrode 222A and the second insulating layer 234, the bottom electrode 222A can have oxide portions 222B at sides thereof. The capacitor thin film 226A can be made of a ferroelectric material such as SBT (SrBiTaOx), PZT (PbZrTiOx) or the like. The bottom electrode 222A can be made of a material such as iridium (Ir), ruthenium (Ru) or the like. It is preferable that if the bottom electrode 222A is Ir, the metal oxides 222A, 222B, 224A are iridium oxide (IrOx), and if the bottom electrode 222A is Ru, the metal oxides 222A, 222B, 224A are ruthenium oxide (RuOx).

In the semiconductor device 200, the bit line 242 is electrically connected to one of the diffusion regions 206 and the top electrode 228A is electrically connected to the other diffusion region 206 through the metal interconnection 244, wherein the bit line 242 and the metal interconnection 244 are electrically disconnected each other. The bottom electrode 222A may be connected to a plate line (not shown) to apply a common constant potential thereto. For improving the adhesion between the bit line 242 and the second insulating layer 234, an adhesion layer 240, e.g., made of a material Ti, TiN and the combination thereof or the like, can be formed on top of the second insulating layer 234.

FIGS. 4A to 4F are schematic cross sectional views setting forth the method for manufacture of a semiconductor memory device 200 in accordance with the present invention.

Figure 4A:
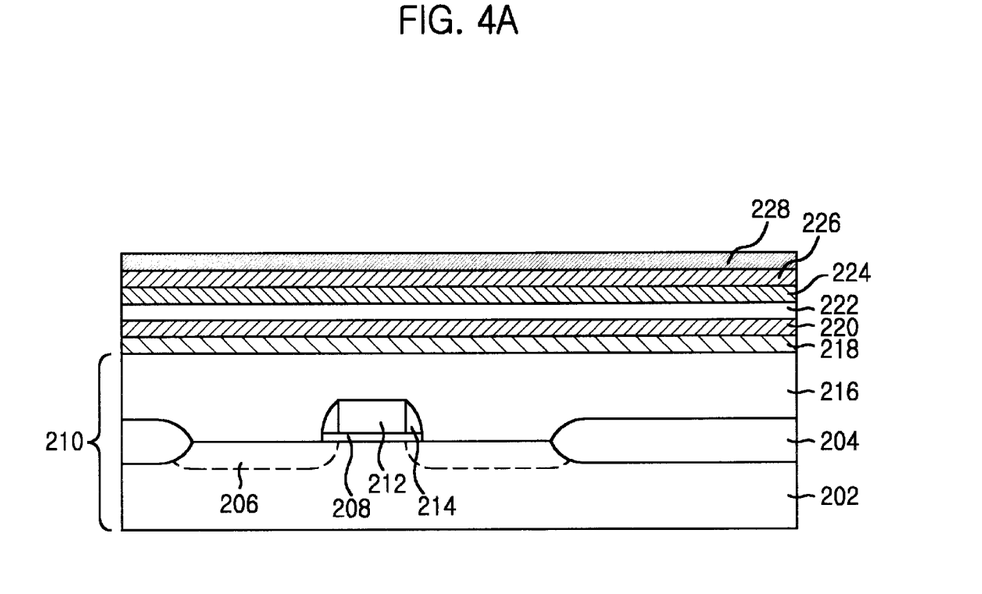
FIGS. 4A to 4F are schematic cross sectional views setting forth a method for the manufacture of the semiconductor memory device in accordance with the present invention.

Referring to FIG. 4A, the process for manufacturing the semiconductor device 200 begins with the preparation of an active matrix 210 including a semiconductor substrate 202, an isolation region 204, diffusion regions 206, a gate oxide 208, a gate line 212, a spacer 214 and a first insulating layer 216. One of the diffusion regions 206 serves as a source and the other diffusion region 206 serves as a drain. The first Ainsulating layer 216 is made of a material, e.g., boron-phosphor-silicate glass (BPSG).

Thereafter, a protection layer 218, e.g., made of $SiO_2$ by hot thermal oxidation (HTO), is formed on top of the first insulating layer 216. The protection layer 218 is baked at a temperature ranging from approximately 100° C. to approximately 400° C. to remove moistures therein. And, a first metal oxide layer 220, e.g., made of a material such as IrOx, RuOx or the like, is formed on top of the protection layer 218. In the preferred embodiment, the first metal oxide layer 220 has a thickness of 100–500 Å. The first metal oxide layer 220 is heated in an oxygen gas atmosphere at a temperature ranging from approximately 200° C. to approximately 600° C.

And then, a first metal layer 222 having a thickness of 1,000–3,000 Å is formed on top of the first metal oxide layer 220. It is preferable that if the first metal oxide layer 220 is IrOx, the first metal layer 222 is Ir and if the first metal oxide layer 220 is RuOx, the first metal layer 222 is Ru. In an ensuing step, the first metal layer 222 is heated in an oxygen gas atmosphere at a temperature ranging from approximately 400° C. to approximately 900° C., thereby obtaining a second metal oxide layer 224.

In the next step, a dielectric layer 226, e.g., made of a ferroelectric material such as SBT, PZT or the like, is formed on top of the second metal oxide layer 224 by using a method such as a spin coating, a chemical vapor deposition (CVD) or the like. In the preferred embodiment, before the formation of the dielectric layer 226, the second metal oxide layer 224 is heated at a temperature ranging from approximately 100° C. to approximately 500° C. in order to improve an adhesion between the second metal oxide layer 224 and the dielectric layer 226.

Thereafter, a second metal layer 228, e.g., made of a material such as IrOx, RuOx or the like, is formed on top of the dielectric layer 226. The second metal layer 228 has a thickness of 1,000–3,000 Å. Before the formation of the second metal layer 228, the dielectric layer 226 is baked at a temperature ranging from 100° C. to 400° C. to remove moistures in the dielectric layer 226. The second metal layer can be made of a conducting material including, but not limited to: platinum (Pt), IrOx, RuOx or the like.

Figure 4B:
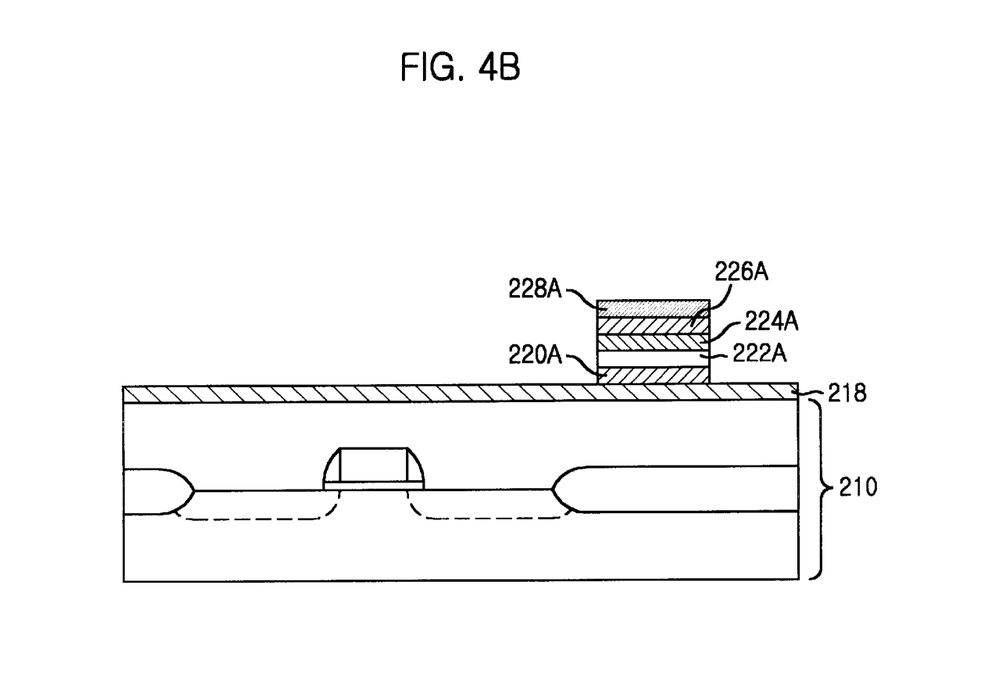

Referring to FIG. 4B, the second metal layer 228 and the dielectric layer 226 are patterned into a first predetermined configuration to obtain a top electrode 228A and a capacitor thin film 226A. And then, the second metal oxide layer 224, the first metal layer 222 and the first metal oxide layer 220 are patterned into a second predetermined configuration to obtain a bottom electrode structure, thereby forming a capacitor structure 250 having a first patterned metal oxide layer 220A, a bottom electrode 222A, a second patterned metal oxide layer 224A, a capacitor thin film 226A and a top electrode 228A. It is preferable that the bottom electrode 222A can have a size different from that of the top electrode 228A for forming a plate line (not shown) during the following processes.

Figure 4C:
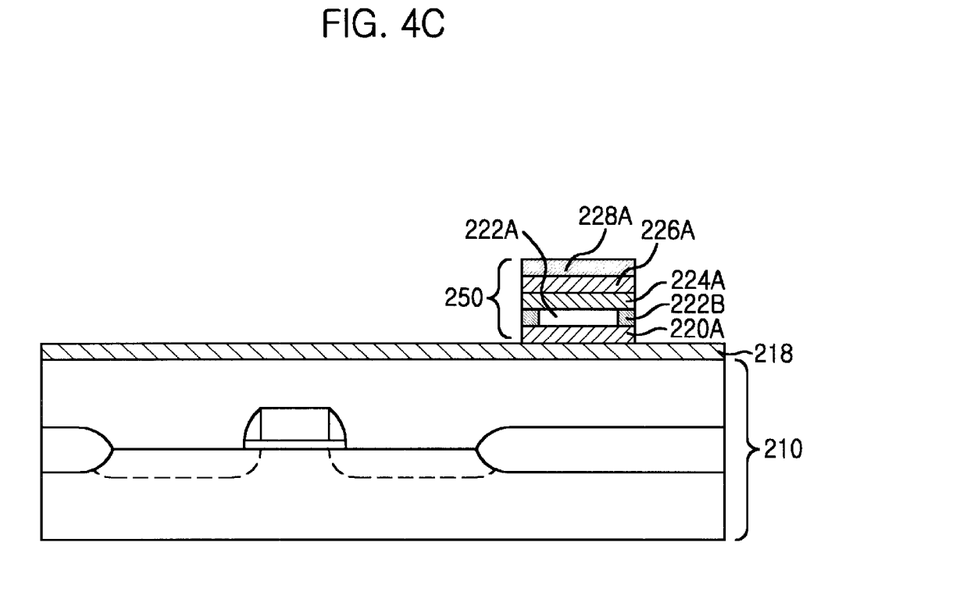

Thereafter, as shown in FIG. 4C, the bottom electrode 222A is heated in an oxygen gas atmosphere at a temperature ranging from approximately 300° C. to approximately 700° C., thereby oxidizing portions 222B of the bottom electrode 222A.

Figure 4D:
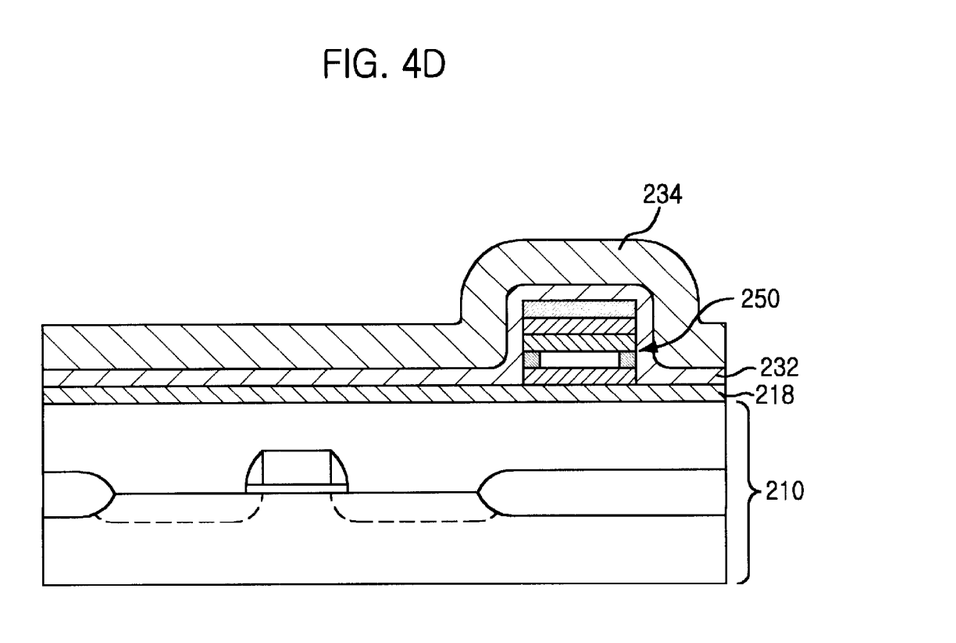

Referring to FIG. 4D, a capping layer 218, e.g., made of an oxide such as TEOS or the like, is formed on top of the capacitor structure 250 and the protection layer 218 by using a method such as CVD. This process is carried out at a temperature ranging from approximately 300° C. to approximately 600° C. in a high pressure, e.g., 1 atm.

In an ensuing step, a second insulating layer 234, made of a material, e.g., BPSG, is formed on top of the capping layer 232 by using a method such as CVD and made flat by means of chemical mechanical polishing (CMP).

Figure 4E:
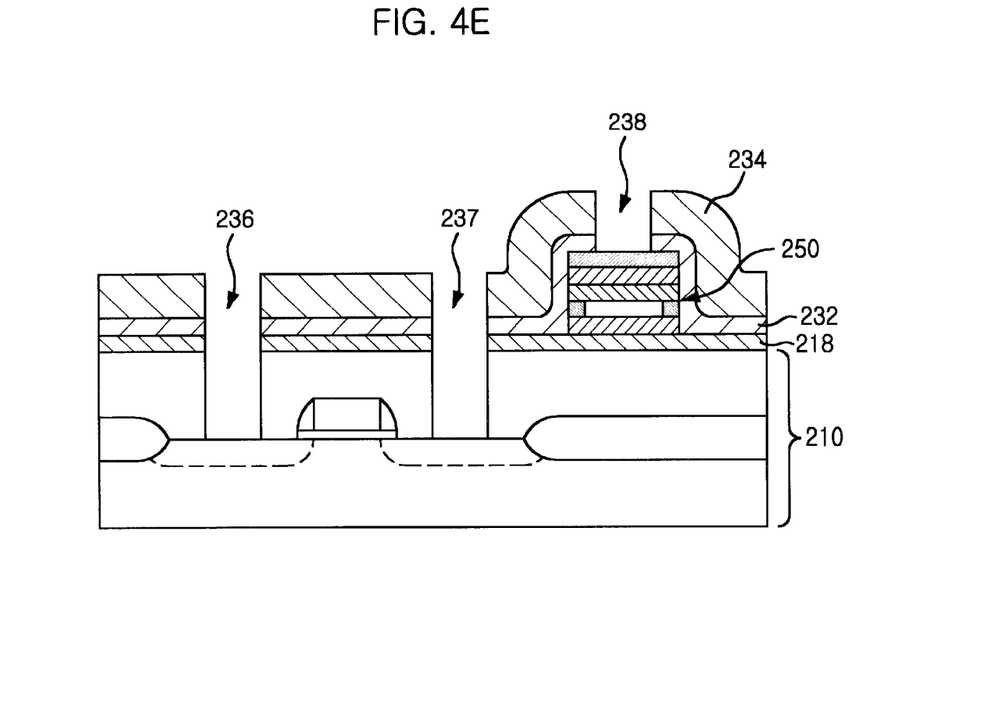

Referring to FIG. 4E, a first and a second openings 236, 237 are formed at positions over the diffusion regions 206 through the second and the first insulating layers 234, 216 by using a method such as a photolithography or a plasma etching, e.g., reactive ion etching (RIE). And, a third opening 238 is formed at a position over the capacitor structure 250 through the second insulating layer 234 and the capping layer 232 by using a method such as a photolithography or a plasma etching.

Figure 4F:
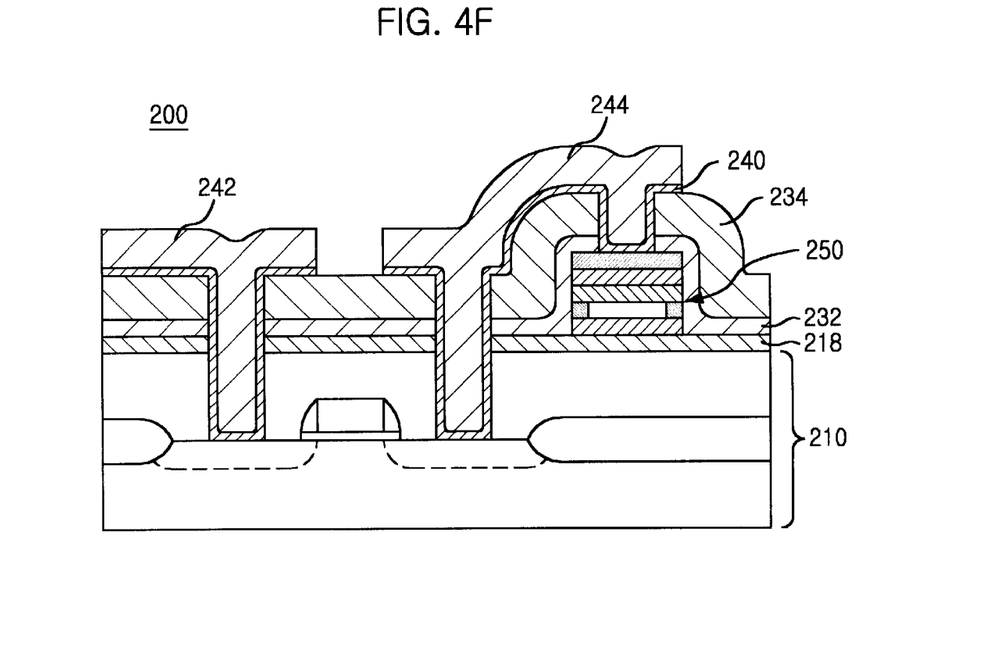

Finally, an interconnection metal layer is formed over the entire surface including the interiors of the openings 236, 237, 238 and is patterned into a preset configuration to form a bit line 242 and a metal interconnection 244, as shown in FIG. 4F. For example, the interconnection layer can be made of a conductive material such as titanium nitride (TiN), polysilicon doped with phosphorus, TiSi$_2$, WSi$_2$, Pt or the like. In the figures, each of the layers is shown as that having a single layer structure for simplification.

In comparison with the prior art, the present invention improves the adhesion between the bottom electrode and the insulating layers adjacent thereto by encompassing the bottom electrode with the metal oxides.

While the present invention has been described with respect to the particular embodiments, it will be apparent to those skilled in the art that various changes and modifications may be made without departing from the scope of the invention as defined in the following claims.

What is claimed is:

1. A semiconductor device for use in a memory cell, comprising:
    an active matrix provided with a semiconductor substrate, a transistor formed on the semiconductor substrate, an isolation region for isolating the transistor and an insulating layer formed on top of the transistor and the isolation region;
    a bottom electrode formed on top of the insulating layer;
    a capacitor thin film placed on top of the bottom electrode; and
    a top electrode formed on top of the capacitor thin film, wherein the bottom electrode includes metal oxide layers and a metal layer, and the metal layer is sandwiched between the metal oxide layers.

2. The semiconductor device of claim 1, wherein the metal oxide layers encompass the metal layer.

3. The semiconductor device of claim 2, wherein the capacitor thin film is one of SBT (SrBiTaOx, and PZT (PbZrTiOx).

4. The semiconductor device of claim 3, wherein the metal layer is one of iridium (Ir) and ruthenium (Ru).

5. The semiconductor device of claim 4, wherein if the metal portion is Ir, the metal oxide portion is IrOx.

6. The semiconductor device of claim 4, wherein if the metal portion is Ru, the metal oxide portion is RuOx.

7. The semiconductor device of claim 1, further comprising a protection layer formed between the insulating layer and the bottom electrode.

8. The semiconductor device of claim 7, wherein the protection layer is made of SiOx.

9. A method for manufacturing a semiconductor device for use in a memory cell, the method comprising steps of:
    a) preparing an active matrix provided with a semiconductor substrate, a transistor including a pair of semiconductor substrate, a transistor including a pair of diffusion regions formed on top of the semiconductor substrate and a first insulating layer formed around the transistor;
    b) forming a first metal oxide layer on top of the first insulating layer;
    c) forming a first metal layer and a second metal oxide layer on top of the first metal oxide layer, subsequently;
    d) forming a dielectric layer on top of the second metal oxide layer;
    e) forming a second metal layer on top of the dielectric layer; and
    f) patterning the second metal layer, the dielectric layer, the second metal oxide layer, the first metal layer and the first metal oxide layer into a first predetermined configuration, thereby obtaining a capacitor structure.

10. The method of claim 9, after the step f), further comprising steps of:
    g) forming a second insulating layer on top of the patterned layers and the first insulating layer;
    h) forming first and second openings into the first and second insulating layers on top of the diffusion regions and forming a third opening into the second insulating layer at a position over the capacitor structure; and
    i) forming an interconnection layer on top of the second insulating layer including interiors of the openings and patterning the interconnection layer into a second predetermined configuration.

11. The method of claim 9, wherein the dielectric layer is one of SBT, and PZT.

12. The method of claim 11, between the steps a) and b), further comprising a step of forming a protection layer.

13. The method of claim 12, wherein the protection layer is made of silicon dioxide ($SiO_2$).

14. The method of claim 13, after the step of forming the protection layer, further comprising a step of baking the protection layer at a temperature ranging from 100° C. to 400° C.

15. The method of claim 14, after the step b), further comprising a step of heat-treating the first metal-oxide layer in an oxygen gas atmosphere at a temperature ranging from 200° C. to 600° C.

16. The method of claim 14, after the formation of the first metal layer, further comprising a step of heat-treating the first metal layer in an oxygen gas atmosphere at a temperature ranging from 400° C. to 900° C., thereby forming the second metal oxide layer.

17. The method of claim 16, before the step d), further comprising a step of heat-treating the second metal oxide layer at a temperature ranging from 100° C. to 500° C.

18. The method of claim 17, before the step e), further comprising a step of baking the dielectric layer at a temperature ranging from 100° C. to 500° C.

19. The method of claim 18, before the step g), further comprising a step of oxidizing edge portions of the patterned first metal layer by heat-treating the patterned layers in an oxygen gas atmosphere at a temperature ranging from 300° C. to 700° C.

20. The method of claim 19, wherein the first metal layer is one of Ir, and Ru.

21. The method of claim 20, wherein if the first metal layer is Ir, the first and the second metal oxide layers are IrOx.

22. The method of claim 21, wherein if the first metal layer is Ru, the first and the second metal oxide layers are RuOx.

23. The method of claim 9, between the steps f), and g), further comprising a step of forming a capping layer at a temperature ranging from 300° C. to 600° C. by using a chemical vapor deposition (CVD) method.

24. The method of claim 23, wherein the capping layer is made of tetra-ethyl ortho-silicate (TEOS).

* * * * *